United States Patent
Nien et al.

(10) Patent No.: US 12,260,903 B2
(45) Date of Patent: Mar. 25, 2025

(54) MEMORY DEVICES WITH IMPROVED BIT LINE LOADING

(71) Applicant: Taiwan Semiconductor Manufacturing Company, Ltd., Hsinchu (TW)

(72) Inventors: Yi-Hsin Nien, Hsinchu (TW); Hidehiro Fujiwara, Hsinchu (TW); Chih-Yu Lin, Taichung (TW); Yen-Huei Chen, Jhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 225 days.

(21) Appl. No.: 17/863,092

(22) Filed: Jul. 12, 2022

(65) Prior Publication Data
US 2024/0021240 A1    Jan. 18, 2024

(51) Int. Cl.
*G11C 11/412* (2006.01)
*G11C 11/419* (2006.01)
*H01L 27/02* (2006.01)
*H10B 10/00* (2023.01)

(52) U.S. Cl.
CPC .......... *G11C 11/419* (2013.01); *G11C 11/412* (2013.01); *H01L 27/0207* (2013.01); *H10B 10/12* (2023.02)

(58) Field of Classification Search
CPC . G11C 11/419; G11C 11/412; H01L 27/0207; H10B 10/12
See application file for complete search history.

(56) References Cited

U.S. PATENT DOCUMENTS

| | | | | |
|---|---|---|---|---|
| 9,659,635 | B1* | 5/2017 | Liaw | G11C 11/419 |
| 2013/0154027 | A1* | 6/2013 | Liaw | H10B 10/12 |
| | | | | 257/E27.06 |
| 2016/0056161 | A1* | 2/2016 | Hong | H10B 10/12 |
| | | | | 257/401 |
| 2016/0064067 | A1* | 3/2016 | Mojumder | G11C 8/16 |
| | | | | 365/154 |
| 2021/0098467 | A1* | 4/2021 | Fujiwara | H01L 29/785 |
| 2021/0366915 | A1* | 11/2021 | Fujiwara | H10B 10/12 |
| 2022/0076740 | A1 | 3/2022 | Yang et al. | |

FOREIGN PATENT DOCUMENTS

TW    202115874 A    4/2021

OTHER PUBLICATIONS

Office Action issued in connection with Taiwan Appl. No. 112121980 dated Jul. 18, 2024.

* cited by examiner

*Primary Examiner* — Mushfique Siddique
(74) *Attorney, Agent, or Firm* — FOLEY & LARDNER LLP

(57) ABSTRACT

A memory array is disclosed. The memory array includes a plurality of memory cells disposed over a substrate. Each of the memory cells is coupled to a corresponding one of a plurality of word lines and a corresponding one of a plurality of bit line pairs. First four of the memory cells that are coupled to four consecutive ones of the word lines and to a first one of the bit line pairs are abutted to one another on the substrate along a single lateral direction.

20 Claims, 9 Drawing Sheets

--Prior Art--

MEMORY DEVICES WITH IMPROVED BIT LINE LOADING

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
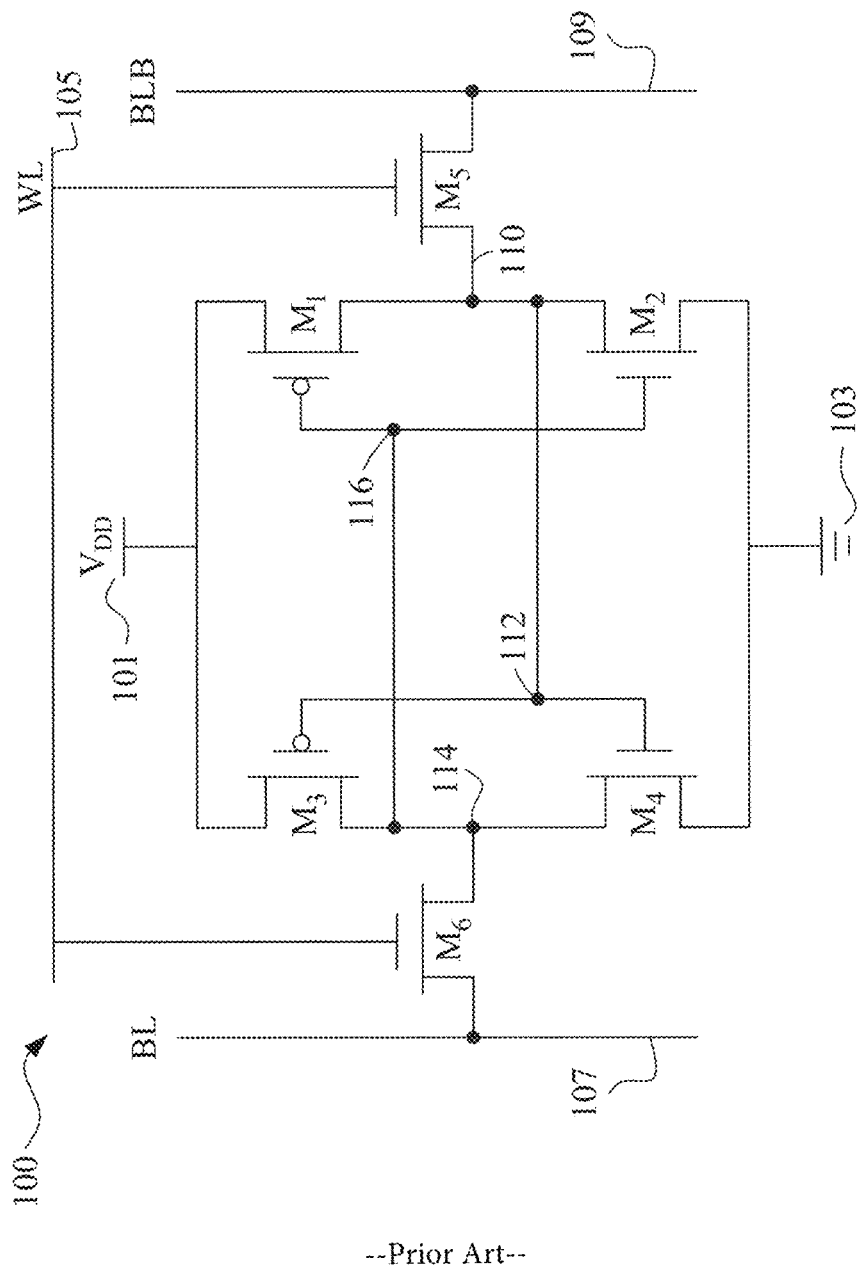
FIG. 1 is an example circuit diagram of a memory cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A common type of integrated circuit memory is a static random access memory (SRAM) device. A typical SRAM memory device has an array of memory cells, or "bit-cells." In some examples, each memory cell uses six transistors connected between an upper reference potential and a lower reference potential (typically ground) such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line to control access to the memory cell during read and write operations by selectively connecting the bit cell to its bit lines.

Typically, an SRAM device has an array of memory cells that include transistors formed using a fin field effect transistor (FinFET) architecture. For example, a polysilicon/metal structure can be connected to a semiconductor fin that extends above an isolation material. The polysilicon/metal structure functions as a gate of the FinFET transistor such that a voltage applied to the gate determines the flow of electrons between source/drain (S/D) contacts connected to the fin on opposite sides of the gate. A threshold voltage of the FinFET transistor is the minimum voltage for the transistor considered to be turned "on" such that an appreciable current can flow between the S/D contacts. The number of gates in contact with a fin along its length that are used in forming a SRAM cell can be considered to be the "pitch," often termed the "contacted polysilicon pitch" or CPP, of the SRAM cell along one dimension and is at least partially determinative of the density of the SRAM device. For example, a four contacted poly pitch (4CPP) SRAM cell includes two pass gate transistors, two PMOS transistors, and two NMOS transistors all formed using a number of fins, the fins having four gates (e.g., polysilicon or metal structures) connected to the fin along its length and having a S/D contact connected to the fin between at least some of the gates.

In the manufacture of typical 2CPP FinFET SRAM architectures, a process step requiring a cut of a portion of the fins in each cell is necessary to form a 6T SRAM cell. In addition, an additional processing step after forming the first set of contacts of each of the cells in the array is needed to form certain shared contacts connecting the gates of the first pair of pull up/pull down transistors forming the first inverter of the memory cell to the sources/drains of the second pair of transistors forming the second inverter of the memory cell so as to form the cross-coupled 6T cell. These shared contacts require a subsequent processing step because they connect cell components, e.g. fins, poly, and contacts, in the orthogonal direction from the source/drain contacts.

An alternative FinFET SRAM architecture is a 4CPP architecture, which does not require a cut of a portion of the fins in each cell and does not need a shared contact requiring a subsequent processing step. However, similar to the 2CPP architectures, typical 4CPP architectures result in an increased loading on the bit lines and complementary bit lines when forming an SRAM array.

For example, an SRAM array (e.g., a 4×4 SRAM array), constructed based on the 2CPP architecture, has four different rows (same column) of the memory cells each disposed across 2CPP, which requires a total of 8CPP (i.e., 4×2CPP) to form a 4×4 SRAM array. Accordingly, bit lines and complementary bit lines of such a 2CPP 4×4 SRAM array extend with a length of at least about 8CPP. Similarly, with the existing 4CPP architecture, even though two rows (same column) of the memory cells can be abutted to each other, corresponding bit lines and complementary bit lines of this 4×4 SRAM array still extend with a length of about 8CPP (as each row extends across 4CPP). Such extended bit lines and complementary bit lines can significantly increase their respective loading (e.g., resistance), especially when the dimensions of a corresponding array increases. Thus, the existing SRAM devices have not been entirely satisfactory in many aspects.

The present disclosure provides various embodiments of a memory device (e.g., an SRAM array) configured in a 4CPP architecture and designed to resolve the above-identified technical issues without compromising the design constraints. In some embodiments, the memory device, as disclosed herein, includes a number (e.g., 4) of double interleaved word lines disposed across a corresponding number (e.g., 4) of memory cells constructed in the 4CPP architecture. The term "double interleaved word lines" may be referred to at least four word lines has connections to four components (e.g., memory cells) at respectively different locations that are offset from one another along a first lateral direction (a direction in parallel with a lengthwise direction of the word lines) and a second lateral direction (a direction orthogonal to the lengthwise direction of the word lines). For example, four different rows (of a first column) of the memory cells may be laterally abutted to each other along a lengthwise direction of the word lines, and the four different rows (of a second column) of the memory cells may be laterally abutted to each other along the same lengthwise direction. As such, a length of corresponding bit lines and complementary bit lines of the disclosed memory device can be significantly reduced to about 4CPP (e.g., 2 times shorter than existing SRAM array). Thus, loading of the bit lines and complementary bit lines of the disclosed memory device can be advantageously reduced. Such reduced loading on the bit lines and complementary bit lines allows the disclosed memory device to scale up (e.g., in dimensions) without compromising its performance.

Referring to FIG. 1, an example circuit diagram of a memory cell (a memory bit, or a bit cell) 100 is illustrated. In accordance with some embodiments of the present disclosure, the memory cell 100 in configured as a static random access memory (SRAM) cell that includes a number of transistors. For example in FIG. 1, the memory cell 100 includes a six-transistor (6T)-SRAM cell. Each of the transistors may be formed in a nanostructure transistor configuration, which shall be discussed in further detail below. In some other embodiments, the memory cell 100 may be implemented as any of a variety of other SRAM cells such as, for example, a two-transistor-two-resistor (2T-2R) SRAM cell, a four-transistor (4T)-SRAM cell, an eight-transistor (8T)-SRAM cell, a ten-transistor (10T)-SRAM cell, etc. Further, although the discussion of the current disclosure is directed to an SRAM cell, it is understood that other embodiments of the current disclosure can also be used in any of the memory cells such as, for example, dynamic random access (DRAM) memory cells.

As shown in FIG. 1, the memory cell 100 includes 6 transistors: M1, M2, M3, M4, M5, and M6. The transistors M1 and M2 are formed as a first inverter and the transistors M3 and M4 are formed as a second inverter, wherein the first and second inverters are cross-coupled to each other. Specifically, the first and second inverters are each coupled between first voltage reference 101 and second voltage reference 103. In some embodiments, the first voltage reference 101 is a voltage level of a supply voltage applied to the memory cell 100, which is typically referred to as "Vdd." The second voltage reference 103 is typically referred to as "ground." The first inverter (formed by the transistors M1 and M2) is coupled to the transistor M5, and the second inverter (formed by the transistors M3 and M4) is coupled to the transistor M6. In addition to being coupled to the first and second inverters, the transistors M6 and M5 are each coupled to a word line (WL) 105 and are coupled to a bit line (BL) 107 and a complementary bit line 109 (sometimes referred to as bit line bar or BLB), respectively.

In some embodiments, the transistors M1 and M3 are referred to as pull-up transistors of the memory cell 100 (hereinafter "pull-up transistor M1" and "pull-up transistor M3," respectively); the transistors M2 and M4 are referred to as pull-down transistors of the memory cell 100 (hereinafter "pull-down transistor M2" and "pull-down transistor M4," respectively); and the transistors M5 and M6 are referred to as access transistors of the memory cell 100 (hereinafter "access transistor M5" and "access transistor M6," respectively). In some embodiments, the transistors M2, M4, M5, and M6 each includes an n-type metal-oxide-semiconductor (NMOS) transistor, and M1 and M3 each includes a p-type metal-oxide-semiconductor (PMOS) transistor. Although the illustrated embodiment of FIG. 1 shows that the transistors M1-M6 are either NMOS or PMOS transistors, any of a variety of transistors or devices that are suitable for use in a memory device may be implemented as at least one of the transistors M1-M6 such as, for example, a bipolar junction transistor (BJT), a high-electron-mobility transistor (HEMT), etc.

The access transistors M5 and M6 each has a gate coupled to the WL 105. The gates of the transistors M5 and M6 are configured to receive a pulse signal, through the WL 105, to allow or block an access of the memory cell 100 accordingly, which will be discussed in further detail below. The transistors M2 and M5 are coupled to each other at node 110 with the transistor M2's drain and the transistor M5's source. The node 110 is further coupled to a drain of the transistor M1 and node 112. The transistors M4 and M6 are coupled to each other at node 114 with the transistor M4's drain and the transistor M6's source. The node 114 is further coupled to a drain of the transistor M3 and node 116.

When a memory cell (e.g., the memory cell 100) stores a data bit, a first node of the bit cell is configured to be at a first logical state (either a logical 1 or a logical 0), and a second node of the bit cell is configured to be at a second logical state (either a logical 0 or a logical 1). The first and second logical states are complementary with each other. In some embodiments, the first logical state at the first node may represent the logical state of the data bit stored in the memory cell. For example, in the illustrated embodiment of FIG. 1, when the memory cell 100 store a data bit at a logical 1 state, the node 110 is configured to be at the logical 1 state, and the node 114 is configured to be at the logical 0 state.

To read the logical state of the data bit stored in the memory cell 100, the BL 107 and BLB 109 are pre-charged to Vdd (e.g., a logical high, e.g., using a capacitor to hold the charge). Then the WL 105 is asserted, or activated, by an assert signal to a logical high, which turns on the access transistors M5 and M6. Specifically, a rising edge of the assert signal is received at the gates of the access transistors M5 and M6, respectively, so as to turn on the access transistors M5 and M6. Once the access transistors M5 and M6 are turned on, based on the logical state of the data bit, the pre-charged BL 107 or BLB 109 may start to be discharged. For example, when the memory cell 100 stores a logical 0, the node 114 (e.g., Q) may present a voltage corresponding to the logical 1, and the node 110 (e.g., Q bar) may present a voltage corresponding to the complementary logical 0. In response to the access transistors M5 and M6 being turned on, a discharge path, starting from the pre-charged BLB 109, through the access transistor M5 and pull-down transistor M2, and to ground 103, may be provided. While the voltage level on the BLB 109 is pulled down by such a discharge path, the pull-down transistor M4 may remain turned off. As such, the BL 107 and the BLB 109 may respectively present a voltage level to produce a large enough voltage difference between the BL 107 and BLB 109. Accordingly, a sensing amplifier, coupled to the BL 107 and BLB 109, can use a polarity of the voltage difference to determine whether the logical state of the data bit is a logical 1 or a logical 0.

To write the logical state of the data bit stored in the memory cell 100, the data to be written is applied to the BL 107 and/or the BLB 109. For example, BLB 109 is tied/shorted to 0V, e.g., ground 103, with a low-impedance connection. Then, the WL 105 is asserted, or activated, by an assert signal to a logical high, which turns on the access transistors M5 and M6. Once the access transistors M5 and M6 are turned on, based on the logical state of BLB 109, the node 110 may start to be discharged. For example, before M5 and M6 are turned on, the BLB 109 may present a voltage corresponding to the logical 0, and the node 110 may present a voltage corresponding to the complementary logical 1. In response to the access transistors M5 and M6 being turned on, a discharge path, starting from the node 110, through the access transistor M5 to ground 103, may be provided. Once the voltage level on the node 110 is pulled down below the Vth (threshold voltage) of the pull-down transistor M4, M4 may turn off and M3 may turn on, causing node 114 to be pulled up to Vdd 101. Once node 114 is less than a Vth from Vdd 101, M1 may turn off and M2 may turn off, causing node 110 to be pulled down to ground 103. Then, when the WL 105 is de-asserted, the logical state applied to the BL 107 and/or the BLB 109 has been stored in the memory cell 100.

Referring to FIGS. 2A-D, an embodiment of a memory device (e.g., a memory array), according to the present disclosure, that includes double interleaved WLs is disclosed. The layouts shown in FIGS. 2A, 2C, and 2D may be used to fabricate each memory cell of the memory device as a number of nanostructure transistors (e.g., FinFETs), in some embodiments. However, it is understood that the layouts are not limited to fabricating nanostructure transistors. Each of the layouts may be used to fabricate any of various other types of transistors such as, for example, nanowire transistors, nanosheet transistors, gate-all-around (GAA) transistors, etc., while remaining within the scope of the present disclosure. The components of the layouts are the same or are substantially similar to those depicted in FIG. 1 with the same reference number, and the detailed description thereof is omitted. It is appreciated that for clarity purposes, each of the layouts in FIGS. 2A, 2C, and 2D has been simplified.

Figure 2A:
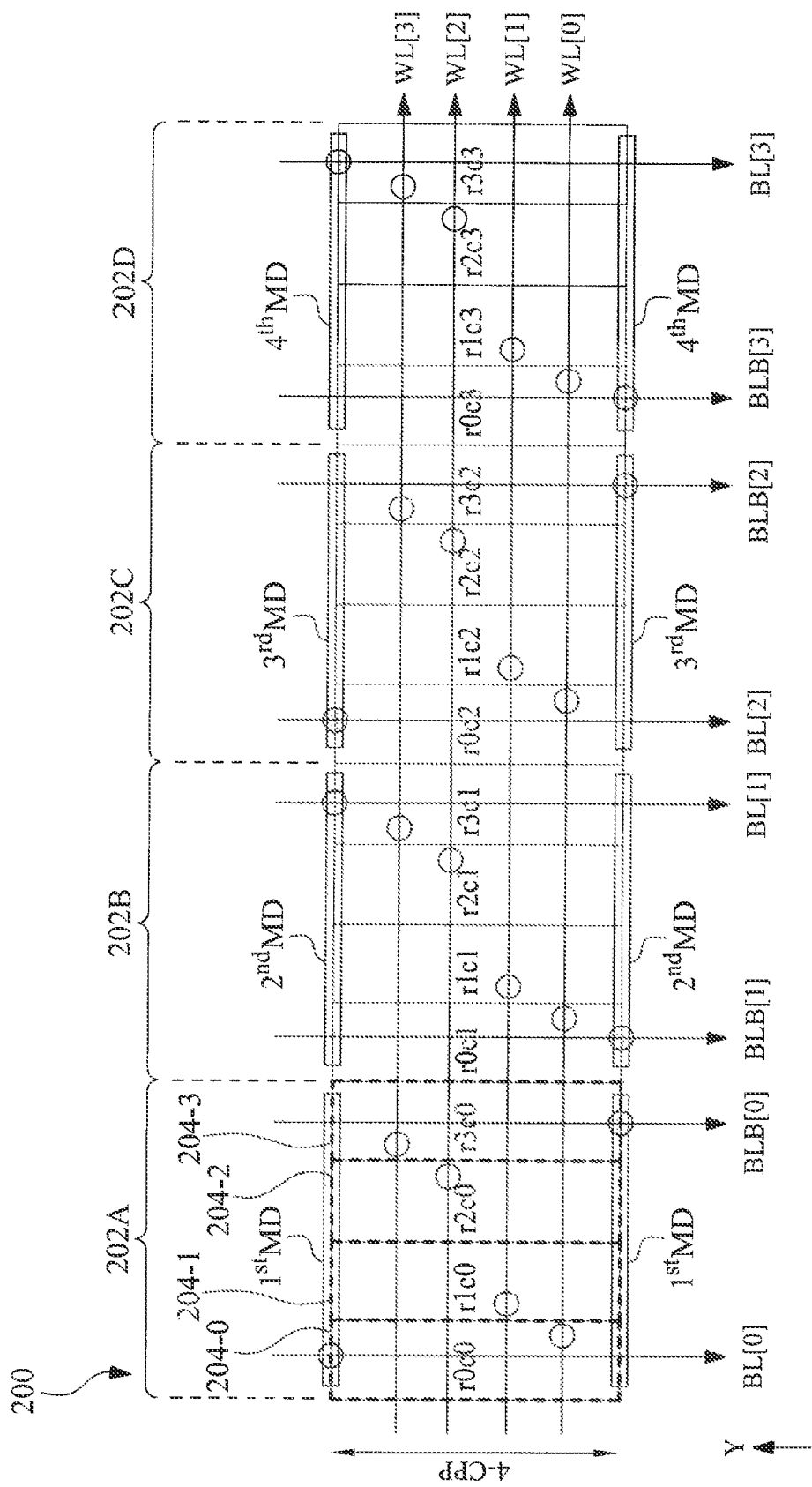
FIG. 2A illustrates an example layout schematic of a memory array, in accordance with some embodiments.

FIG. 2A illustrates an example layout schematic 200 of a memory array (e.g., 220 in FIG. 2B) configured in a 4CPP architecture, in accordance with some embodiments of the present disclosure. As a non-limiting example in FIG. 2B, a circuit diagram of the memory array 220 corresponding to the layout schematic 200 is shown. The memory array 220 has sixteen memory cells 222 arranged in a column-row configuration.

Figure 2B:
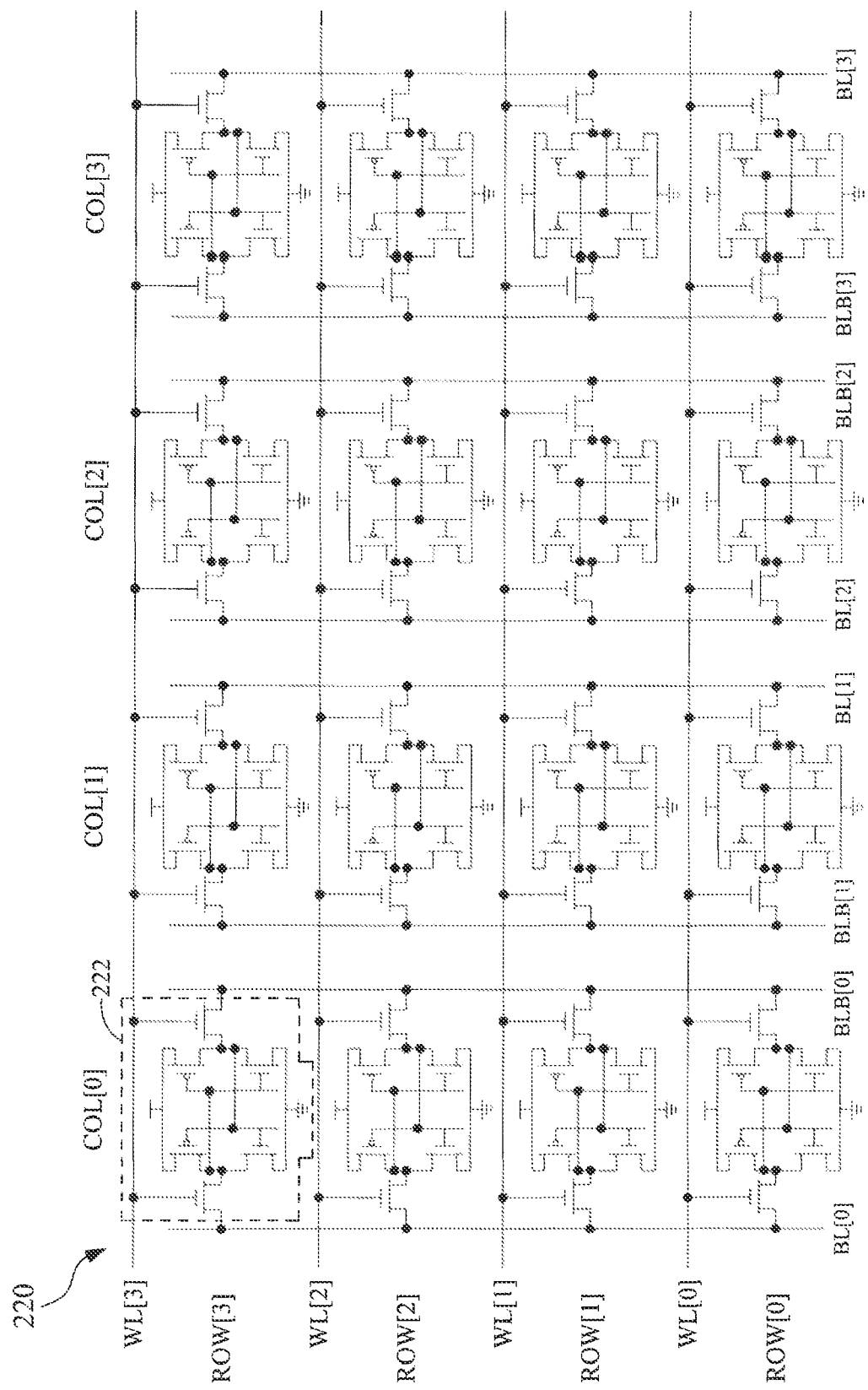
FIG. 2B illustrates an example circuit diagram corresponding to the memory array of FIG. 2A, in accordance with some embodiments.

Referring first to FIG. 2B, the sixteen memory cells 222 are arranged in four columns (e.g., COL[0], COL[1], COL[2], and COL[3]) and four rows (e.g., ROW [0], ROW[1], ROW[2], and ROW[3]) intersecting with one another, and each of the memory cells 222 is at an intersection of a corresponding pair of the columns and rows. Along each of the columns, a pair of bit line (BL) and complementary bit line (BLB) are disposed; and along each of the rows, a word line (WL) is disposed.

For example, along COL[0], the memory array 220 includes bit line BL[0] and complementary bit line BLB[0]; along ROW[0], the memory array 220 includes word line WL[0]; along COL[1], the memory array 220 includes bit line BL[1] and complementary bit line BLB[1]; along ROW [1], the memory array 220 includes word line WL[1]; along COL[2], the memory array 220 includes bit line BL[2] and complementary bit line BLB[2]; along ROW[2], the memory array 220 includes word line WL[2]; along COL[3], the memory array 220 includes bit line BL[3] and complementary bit line BLB[3]; and along ROW[3], the memory array 220 includes word line WL[3]. In some embodiments, the memory cells 222 in COL[0], across all four rows ROW[0] to ROW[3], share the bit line BL[0] and complementary bit line BLB[0]; the memory cells 222 in COL[1], across all four rows ROW[0] to ROW[3], share the bit line BL[1] and complementary bit line BLB[1]; the memory cells 222 in COL[2], across all four rows ROW[0] to ROW[3], share the bit line BL[2] and complementary bit line BLB[2]; and the memory cells 222 in COL[3], across all four rows ROW[0] to ROW[3], share the bit line BL[3] and complementary bit line BLB[3].

Referring next to FIG. 2A, the layout schematic 200 includes four blocks, 202A, 202B, 202C, and 202D, abutted to one another along a lateral direction (e.g., the X direction), and each block can correspond to the memory cells across four different rows and along a common column, in accordance with various embodiments. For example in FIG. 2A, the block 202A corresponds to the memory cells disposed across rows ROW[0] to ROW[3] and along column COL[0]; the block 202B corresponds to the memory cells disposed across rows ROW[0] to ROW[3] and along column COL[1]; the block 202C corresponds to the memory cells disposed across rows ROW[0] to ROW[3] and along column COL[2]; and the block 202D corresponds to the memory cells disposed across rows ROW[0] to ROW[3] and along column COL[3].

Further, each block includes four sub-blocks abutted to one another along the lateral direction (e.g., the X direction), and each sub-block can correspond to a memory cell, in accordance with various embodiments. Using the block 202A as a representative example, the block 202A has four sub-blocks, 204-0, 204-1, 204-2, and 204-3. The sub-block 204-0 corresponds to the memory cell at the intersection of ROW[0] and COL[0] (herein referred to as "cell r0c0"); the sub-block 204-1 corresponds to the memory cell at the intersection of ROW[1] and COL[0] (herein referred to as "cell r1c0"); the sub-block 204-2 corresponds to the memory cell at the intersection of ROW[2] and COL[0] (herein referred to as "cell r2c0"); and the sub-block 204-3 corresponds to the memory cell at the intersection of ROW[3] and COL[0] (herein referred to as "cell r3c0").

In various embodiments, each of the blocks 202A to 202D is configured in a 4CPP architecture. Alternatively stated, each block has four polysilicon/metal (gate) structures traversing thereacross. Based on the disclosed arrangement, each sub-block can also have four polysilicon/metal (gate) structures traversing thereacross. These four gates can correspond to WL[0] of ROW[0], WL[1] of ROW[1], WL[2] of ROW[2], and WL[3] of ROW[3], respectively. Accordingly, the memory cells of different rows and in the same column may be spaced from or otherwise arranged with one another based on such interleaved word lines WL[0] to WL[3], and the memory cells of different columns (which are formed as respective blocks) can be laterally abutted to one another using the interleaved word lines WL[0] to WL[3], as shown in FIG. 2A.

Further, the four sub-blocks of each block can share a common pair of bit lines and complementary bit lines. Alternatively stated, the memory cells of different rows and in the same column can shared a common pair of bit lines and complementary bit lines. For example, the four sub-blocks 204-0 to 204-3 of the block 202A (the memory cells 222 along COL[0] and across ROW[0] to ROW[3]) share bit line BL[0] and complementary bit line BLB [0] through a pair of first source/drain interconnect structures ($1^{st}$ MDs); the four sub-blocks of the block 202B (the memory cells 222 along COL[1] and across ROW[0] to ROW[3]) share bit line BL[1] and complementary bit line BLB [1] through a pair of second source/drain interconnect structures ($2^{nd}$ MDs); the four sub-blocks of the block 202C (the memory cells 222 along COL[2] and across ROW[0] to ROW[3]) share bit line BL[2] and complementary bit line BLB[2] through a pair of third source/drain interconnect structures ($3^{rd}$ MDs); and the four sub-blocks of the block 202D (the memory cells 222 along COL[3] and across ROW[0] to ROW[3]) share bit line BL[3] and complementary bit line BLB[3] through a pair of fourth source/drain interconnect structures ($4^{th}$ MDs), which will also be discussed in further detail below.

With the disclosed arrangement, each of the bit lines and complementary bit lines may have a length that is about 4CPP, in accordance with various embodiments of the present disclosure. Such a significantly shorten length (e.g., in comparison with the 8CPP length of existing memory devices) allows the disclosed memory device to more flexibly scale up in dimensions, without sacrificing the loading on the bit lines (and complementary bit lines). For example, to form a 8×8 memory array, the length of bit lines and complementary bit lines of such a memory array may only be increased to about 8CPP, instead of 16CPP in the existing memory devices. Shorter bit lines typically have less resistance, which can advantageously decrease voltage drop along the bit lines and can in turn increase operation speed of the memory device.

Although the word lines (e.g., WL[0] to WL[3]) and bit lines (e.g., BL[0] to BL[3], BLB[0] to BLB[3]) are shown as extending along the X direction and the Y direction, respectively, in the layout schematic 200 of FIG. 2A, it should be understood that corresponding physical interconnect structures functioning as such access lines can extend along the other direction while remaining within the scope of the present disclosure. Further, while the bit lines BL[0] to BL[3] (including BLB[0] to BLB[3]) can be formed as interconnect structures, respectively, in a bottommost metallization layer (sometimes referred to as "M0 tracks") that extend along the Y direction and the word lines WL[0] to WL[3] can be formed as interconnect structures, respectively, in a next upper metallization layer (sometimes referred to as "M1 tracks") that extend along the X direction, the word lines WL[0] to WL[3] can be formed in one or more even upper metallization layers. For example, the word lines WL[0] to WL[3] may be formed as interconnect structures, respectively, in an even upper metallization layer (e.g., as M3 tracks or M5 tracks) that extend along the X direction. In yet another example, a first subgroup of the word lines, e.g., WL[0] and WL[2], may be formed as M3 tracks, respectively, and a second subgroup of the word lines, e.g., WL[1] and WL[3], may be formed as M5 tracks, respectively.

Figure 2C:
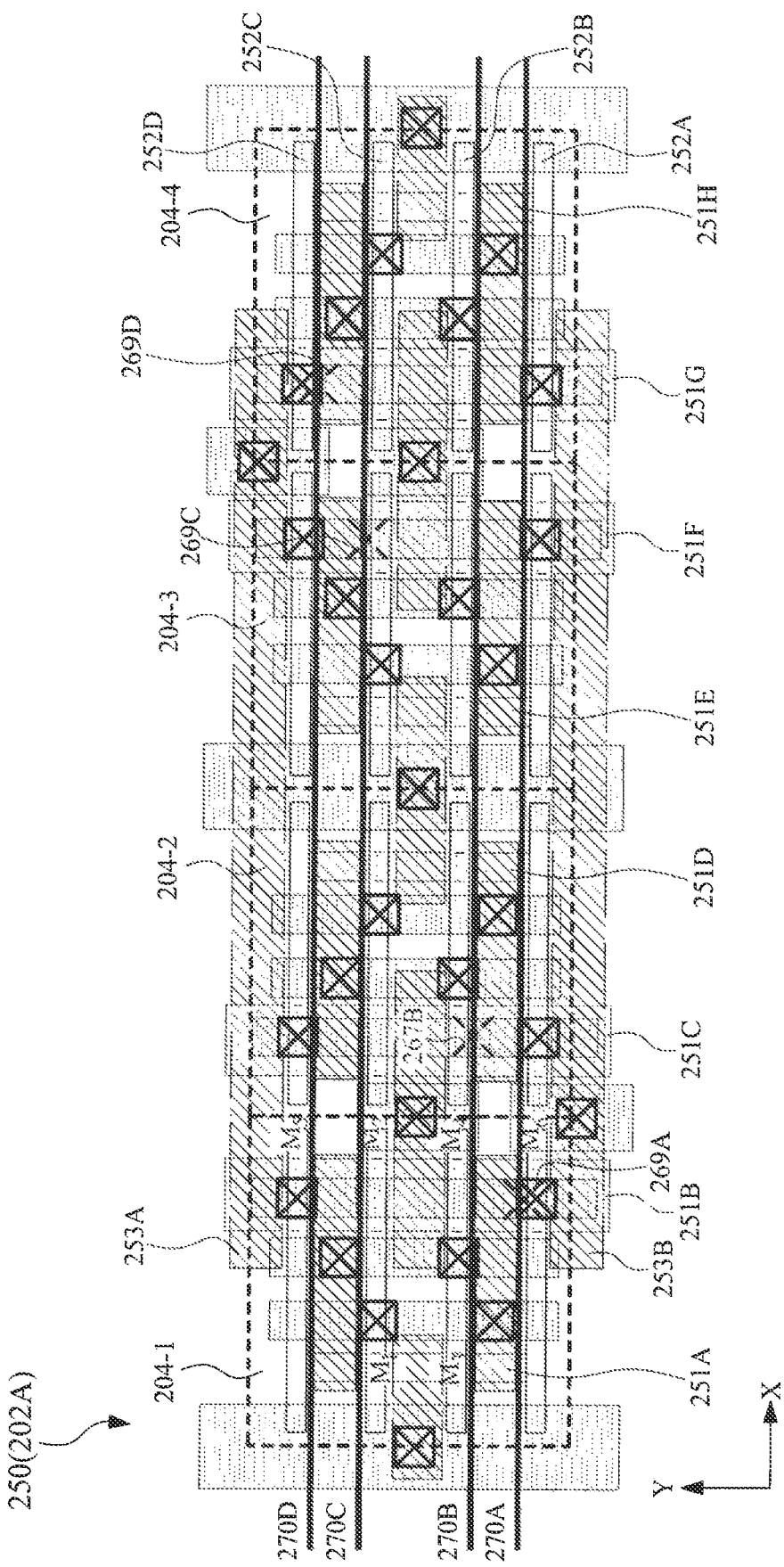
FIG. 2C illustrates an example layout of the memory array of FIG. 2A, in accordance with some embodiments.
Figure 2D:
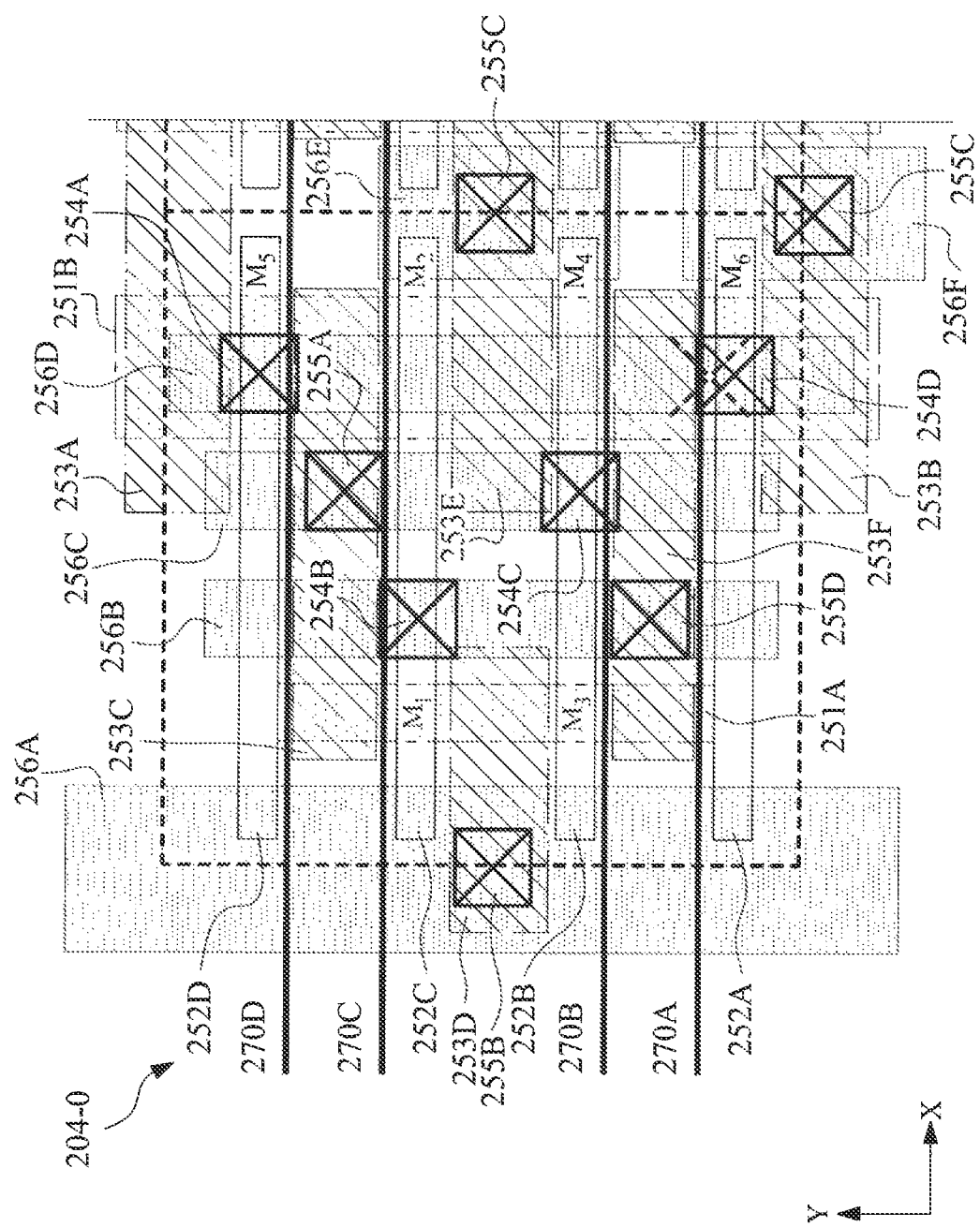
FIG. 2D illustrates an example layout of one of the memory cells of the memory array of FIG. 2A, in accordance with some embodiments.

FIG. 2C illustrates an example layout of one of the blocks in the layout schematic 200 (FIG. 2A), which corresponds to the memory cells across four different rows and along the same column, and FIG. 2D illustrates an enlarged layout of one of the sub-blocks in the layout schematic 200 (FIG. 2A), which corresponds to one of the memory cells, in accordance with various embodiments of the present disclosure. As a representative example, a layout 250 of the block 202A is shown in FIG. 2C, and a portion of the layout 250 is shown in FIG. 2D to illustrate the sub-block 204-0.

Referring first to FIG. 2C, the layout 250 includes patterns 251A, 251B, 251C, 251D, 251E, 251F, 251G, and 251H extending along the Y direction, and patterns 252A, 252B, 252C, and 252D extending along the X direction. The patterns 251A to 251H are each configured to form an active region (e.g., a fin structure, a well, a protruding structure having alternately stacked silicon and silicon germanium layers, etc., which is sometimes referred to as an oxide diffusion (OD) region) over a substrate, and the patterns 252A to 252D are each configured to form a gate (e.g., a polysilicon gate, a metal gate, etc.) over the active regions. Accordingly, the patterns 251A to 251H may each be referred to as an active region, and the patterns 252A to 252D may each be referred to as a gate.

In some embodiments, the active regions 251A, 251D, 251E, and 251H may each have n-type conductivity, and the active regions 251B, 251C, 251F, and 251G may each have p-type conductivity. The gates 252A to 252D can each be divided into a number of portions. As such, the six transistors, M1 to M6, of the memory cells (of the block 202A) can be formed by the corresponding ones of the active regions and the gates. Using the sub-block 204-0 (one of the memory cells) as a representative example, the pull-up transistor M1 can be formed by the active region 251A and a portion of the gate 252C; the pull-up transistor M3 can be formed by the active region 251A and a portion of the gate 252B; the access transistor M5 can be formed by the active region 251B and a portion of the gate 252D; the access transistor M6 can be formed by the active region 251B and a portion of the gate 252A; the pull-down transistor M2 can be formed by the active region 251B and a portion of the gate 252C; and the pull-down transistor M4 can be formed by the active region 251B and a portion of the gate 252B.

The layout 250 further includes patterns configured to form a number of interconnect structures to operatively (e.g., electrically) couple the transistors to one another, forming the circuit shown in FIGS. 1 and 2B. For example, the layout 250 includes patterns 253A and 253B configured to form source/drain interconnect structures (e.g., MDs). The patterns 253A and 253B are hereinafter referred to as "MD 253A" and "MD 253B," respectively. Such MDs 253A and 253B can extend (e.g., along the lengthwise direction of the gates) across different sub-blocks (memory cells) 204-0 to 204-3, in some embodiments. As such, the MDs 253A and 253B can couple the memory cells (204-0 to 204-3) at respectively different rows and the same column to one another. In some embodiments, the MDs 253A and 253B may serve as local connections pads for the BL[0] and BLB [0], BL[1] and BLB [1], BL[2] and BLB [2], and BL[3] and BLB [3], respectively. Continuing with the example of sub-block 204-0, the MD 253A can couple a source/drain of the access transistor M5 to the respective sources/drains of access transistors of other memory cells, and the MD 253B can couple a source/drain of the access transistor M6 to the respective sources/drains of access transistors of other memory cells.

In another example, the layout 250 includes patterns 270A, 270B, 270C, and 270D configured to form interconnect structures (e.g., M1 tracks). The patterns 270A, 270B, 270C, and 270D are hereinafter referred to as "M1 track 270A," "M1 track 270B," "M1 track 270C," and "M1 track 270D," respectively. In some embodiments, the M1 tracks 270A to 270D can each extend (e.g., along the lengthwise direction of the gates) across different sub-blocks (memory cells) 204-0 to 204-3. As such, the M1 tracks 270A to 270D may be configured to function as WL[0], WL[1], WL[2], and WL[3], respectively. Further, the layout 250 includes patterns 269A, 269B, 269C, and 269D configured to form via structures (e.g., V0s). The patterns 269A, 269B, 269C, and 269D are hereinafter referred to as "V0 269A," "V0 269B," "V0 269C," and "V0 269D," respectively. In some embodiments, each of the V0s 269A to 269D is configured to connect a corresponding one of the M1 tracks 270A to 270D to a corresponding M0 track (disposed one layer below the M1 tracks), which is then connected to one or more gates through respective via structures (e.g., VGs). Such interconnect structures, together with the forgoing via structures, will be discussed in further detail with respect to FIG. 2D.

Referring then to FIG. 2D, in addition to the MDs 253A and 253B, the layout 250 further includes patterns 253C, 253D, 253E, and 253F for forming respective MDs (hereinafter "MD 253C," "MD 253D," "MD 253E," and "MD 253F," respectively). Such MDs 253C to 253F may each be configured as an internal connection pad to couple different transistors to each other, or couple a corresponding transistor to an interconnection structure (e.g., an M0 track). For example, the MD 253C can couple the access transistor M5 to the pull-up transistor M1 and the pull-down transistor M2, and the MD 253F can couple the access transistor M6 to the pull-up transistor M3 and the pull-down transistor M4.

The layout 250 further includes patterns 254A, 254B, 254C, and 254D for forming respective via structures VGs (hereinafter "VG 254A," "VG 254B," "VG 254C," and "VG 254D," respectively). Such VGs 254A to 254D may each be configured to couple a corresponding gate to an interconnection structure (e.g., an M0 track). The layout 250 further includes patterns 255A, 255B, 255C, 255D, and 255E for forming respective via structures VDs (hereinafter "VD 255A," "VD 255B," "VD 255C," "VD 255D," and "VD 255E," respectively). Such VDs 255A to 255E may each be configured to couple a corresponding MD to an interconnection structure (e.g., an M0 track).

The layout 250 further includes patterns 256A, 256B, 256C, 256D, 256E, and 256F for forming respective M0 tracks (hereinafter "M0 track 256A," "M0 track 256B," "M0 track 256C," "M0 track 256D," "M0 track 256E," and "M0 track 256F," respectively). In some embodiments, the M0 track 256A may be connected to Vdd, and the M0 track 256E may be connected to ground. As such, the pull-up transistors M1 and M3 can be coupled to Vdd (M0 track 256A) through the MD 253D and VD 255B, and the pull-down transistors M2 and M4 can be coupled to ground (M0 track 256E) through the MD 253E and VD 255C. Further, the M0 track 256C can be coupled to the MD 253C (which is connected to the pull-up transistor M1, access transistor M5, and pull-down transistor M2) through the VD 255A, and the M0 track 256B can be coupled to the MD 253F (which is connected to the pull-up transistor M3, access transistor M6, and pull-down transistor M4) through the VD 255D.

Figure 3:
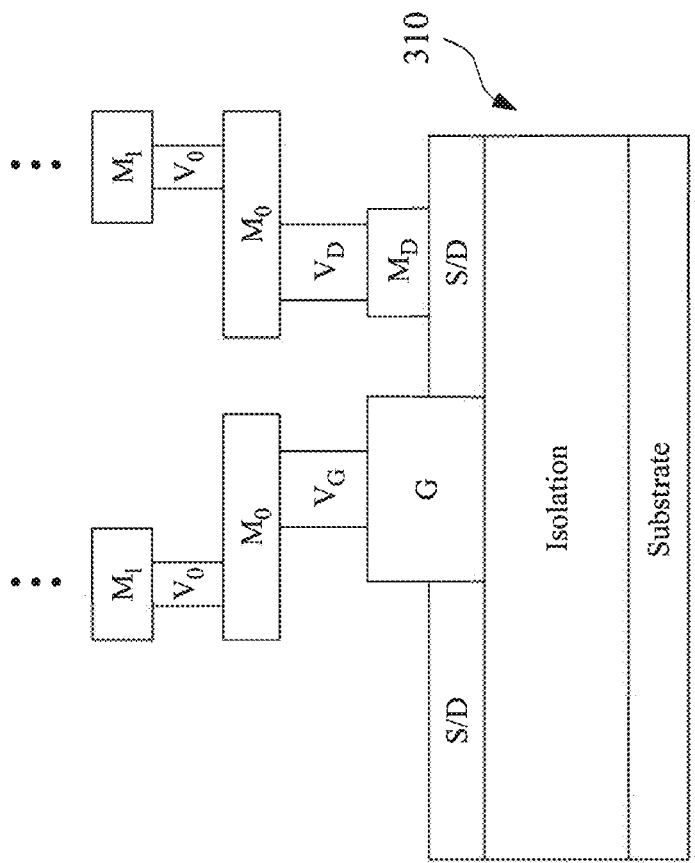
FIG. 3 illustrates a cross-sectional view of a portion of a semiconductor device, in accordance with some embodiments.

To further illustrate relative (e.g., vertical) arrangement of these structures, FIG. 3 depicts a cross-sectional view of a portion of a semiconductor device including a gate, a source, a drain, an MD, a VD, a VG, M0 tracks, V0s, and M1 tracks. As shown, a transistor 310 (e.g., one of the pull-up transistor, pull-down transistor, and access transistor, as discussed above) is formed over a substrate. The transistor 310 includes a gate, a pair of source and drain disposed on the opposite sides of the gate. The transistor 310 may be formed as a FinFET in which an active region is formed as a fin structure, with a portion overlaid by the gate functioning as its gate and with the portions on the sides respectively functioning as its source and drain. Further, a power portion of fin structure is embedded by an isolation region/structure. Over the transistor 310, the VG is connected to the gate, the MD is connected to at least one of the source and drain, the VD is connected to the MD, one of the M0 tracks is connected to the VG and coupled to one of the M1 tracks through one of the V0s, and another one of the M0 tracks is connected to VD and coupled to another of the M1 tracks through another of the V0s.

Figure 4A:
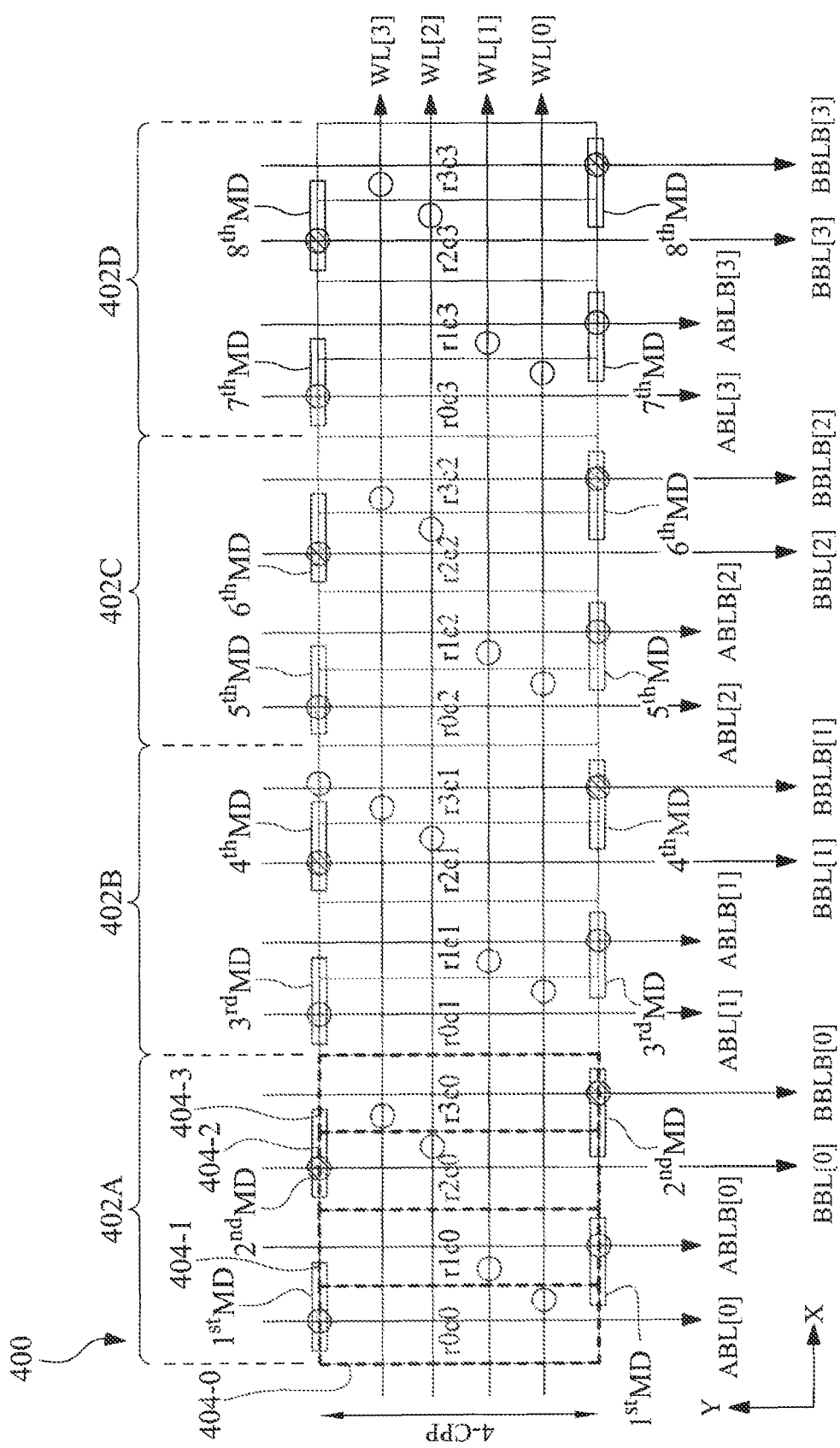
FIG. 4A illustrates an example layout schematic of another memory array, in accordance with some embodiments.

FIG. 4A illustrates another example layout schematic 400 of a memory array (e.g., 420 in FIG. 4B) configured in a 4CPP architecture, in accordance with some embodiments of the present disclosure. As a non-limiting example in FIG. 4B, a circuit diagram of the memory array 420 corresponding to the layout schematic 400 is shown. The memory array 420 has sixteen memory cells 422 arranged in a column-row configuration.

Figure 4B:
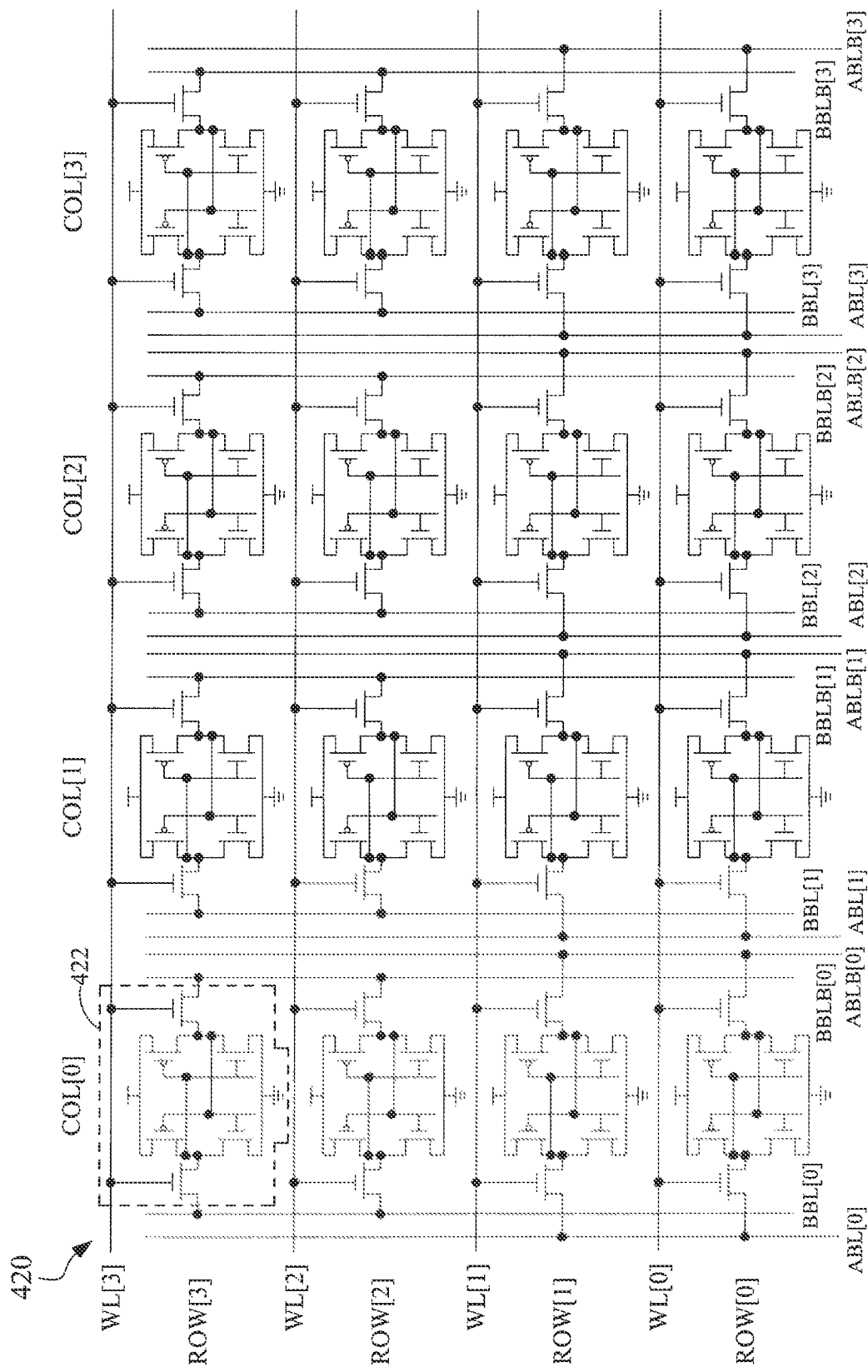
FIG. 4B illustrates an example circuit diagram corresponding to the memory array of FIG. 4A, in accordance with some embodiments.

Referring first to FIG. 4B, the sixteen memory cells 422 are arranged in four columns (e.g., COL[0], COL[1], COL [2], and COL[3]) and four rows (e.g., ROW [0], ROW[1], ROW[2], and ROW[3]) intersecting with one another, and each of the memory cells 422 is at an intersection of a corresponding pair of the columns and rows. Along each of the columns, a pair of first bit line (ABL) and first complementary bit line (ABLB) and a pair of second bit line (BBL) and second complementary bit line (BBLB) are disposed; and along each of the rows, a word line (WL) is disposed.

For example, along COL[0], the memory array 420 includes first bit line ABL[0], first complementary bit line ABLB[0], second bit line BBL[0], and second complementary bit line BBLB [0]; along ROW[0], the memory array 420 includes word line WL[0]; along COL[1], the memory array 420 includes first bit line ABL[1], first complementary bit line ABLB[1], second bit line BBL[1], and second complementary bit line BBLB[1]; along ROW[1], the memory array 420 includes word line WL[1]; along COL[2], the memory array 420 includes first bit line ABL[2], first complementary bit line ABLB[2], second bit line BBL[2], and second complementary bit line BBLB[2]; along ROW [2], the memory array 420 includes word line WL[2]; along COL[3], the memory array 420 includes first bit line ABL [3], first complementary bit line ABLB[3], second bit line BBL[3], and second complementary bit line BBLB[3]; and along ROW[3], the memory array 420 includes word line WL[3].

In some embodiments, the memory cells 422 in COL[0], across first two of the rows ROW[0] and ROW[1], share the first bit line ABL[0] and first complementary bit line ABLB

[0]; the memory cells 422 in COL[0], across second two of the rows ROW[2] and ROW[3], share the second bit line BBL[0] and second complementary bit line BBLB[0]; the memory cells 422 in COL[1], across first two of the rows ROW[0] and ROW[1], share the first bit line ABL[1] and first complementary bit line ABLB[1; the memory cells 422 in COL[1], across second two of the rows ROW[2] and ROW[3], share the second bit line BBL[1] and second complementary bit line BBLB[1]; the memory cells 422 in COL[2], across first two of the rows ROW[0] and ROW[1], share the first bit line ABL[2] and first complementary bit line ABLB[2]; the memory cells 422 in COL[2], across second two of the rows ROW[2] and ROW[3], share the second bit line BBL[2] and second complementary bit line BBLB[2]; the memory cells 422 in COL[3], across first two of the rows ROW[0] and ROW[1], share the first bit line ABL[3] and first complementary bit line ABLB[3]; and the memory cells 422 in COL[3], across second two of the rows ROW[2] and ROW[3], share the second bit line BBL[3] and second complementary bit line BBLB[3].

Referring next to FIG. 4A, the layout schematic 400 includes four blocks, 402A, 402B, 402C, and 402D, abutted to one another along a lateral direction (e.g., the X direction), and each block can correspond to the memory cells across four different rows and along a common column, in accordance with various embodiments. For example in FIG. 4A, the block 402A corresponds to the memory cells disposed across rows ROW[0] to ROW[3] and along column COL[0]; the block 402B corresponds to the memory cells disposed across rows ROW[0] to ROW[3] and along column COL[1]; the block 402C corresponds to the memory cells disposed across rows ROW[0] to ROW[3] and along column COL[2]; and the block 402D corresponds to the memory cells disposed across rows ROW[0] to ROW[3] and along column COL[3].

Further, each block includes four sub-blocks abutted to one another along the first lateral direction (e.g., the X direction), and each sub-block can correspond to a memory cell, in accordance with various embodiments. Using the block 402A as a representative example, the block 202A has four sub-blocks, 404-0, 404-1, 404-2, and 404-3. The sub-block 404-0 corresponds to the memory cell at the intersection of ROW[0] and COL[0] (herein referred to as "cell r0c0"); the sub-block 404-1 corresponds to the memory cell at the intersection of ROW[1] and COL[0] (herein referred to as "cell r1c0"); the sub-block 404-2 corresponds to the memory cell at the intersection of ROW[2] and COL[0] (herein referred to as "cell r2c0"); and the sub-block 404-3 corresponds to the memory cell at the intersection of ROW[3] and COL[0] (herein referred to as "cell r3c0").

In various embodiments, each of the blocks 402A to 402D is configured in a 4CPP architecture. Alternatively stated, each block has four polysilicon/metal (gate) structures traversing thereacross. Based on the disclosed arrangement, each sub-block can also have four polysilicon/metal (gate) structures traversing thereacross. These four gates can correspond to WL[0] of ROW[0], WL[1] of ROW[1], WL[2] of ROW[2], and WL[3] of ROW[3], respectively. Accordingly, the memory cells of different rows and in the same column may be spaced from or otherwise arranged with one another based on such interleaved word lines WL[0] to WL[3], and the memory cells of different columns (which are formed as respective blocks) can be laterally abutted to one another using the interleaved word lines WL[0] to WL[3], as shown in FIG. 4A.

Further, two adjacent ones of the sub-blocks of each block can share a common pair of first bit lines and first complementary bit lines, and the other two adjacent ones of the sub-blocks of the same block can share a common pair of second bit lines and second complementary bit lines. Alternatively stated, the memory cells of first two rows and in the same column can shared a common pair of first bit lines and first complementary bit lines, and the memory cells of second two rows and in the same column can shared a common pair of second bit lines and second complementary bit lines.

For example, the first two sub-blocks 404-0 and 404-1 of the block 402A (the memory cells 422 along COL[0] and across ROW[0] to ROW[1]) share bit line ABL[0] and complementary bit line ABLB [0] through a pair of first source/drain interconnect structures ($1^{st}$ MDs); and the second two sub-blocks 404-2 and 404-3 of the block 402A (the memory cells 422 along COL[0] and across ROW[2] to ROW[3]) share bit line BBL[0] and complementary bit line BBLB [0] through a pair of second source/drain interconnect structures ($2^{nd}$ MDs). Similarly, the first two sub-blocks of the block 402B (the memory cells 422 along COL[1] and across ROW[0] to ROW[1]) share bit line ABL[1] and complementary bit line ABLB [1] through a pair of third source/drain interconnect structures ($3^{rd}$ MDs); and the second two sub-blocks of the block 402B (the memory cells 422 along COL[1] and across ROW[2] to ROW[3]) share bit line BBL[1] and complementary bit line BBLB[1] through a pair of fourth source/drain interconnect structures ($4^{th}$ MDs). The first two sub-blocks of the block 402C (the memory cells 422 along COL[2] and across ROW[0] to ROW[1]) share bit line ABL[2] and complementary bit line ABLB [2] through a pair of fifth source/drain interconnect structures ($5^{th}$ MDs); and the second two sub-blocks of the block 402C (the memory cells 422 along COL[2] and across ROW[2] to ROW[3]) share bit line BBL[2] and complementary bit line BBLB[2] through a pair of sixth source/drain interconnect structures ($6^{th}$ MDs). The first two sub-blocks of the block 402D (the memory cells 422 along COL[3] and across ROW[0] to ROW[1]) share bit line ABL[3] and complementary bit line ABLB[3] through a pair of seventh source/drain interconnect structures ($7^{th}$ MDs); and the second two sub-blocks of the block 402D (the memory cells 422 along COL[3] and across ROW[2] to ROW[3]) share bit line BBL[3] and complementary bit line BBLB [3] through a pair of eighth source/drain interconnect structures ($8^{th}$ MDs).

With the disclosed arrangement, each of the bit lines and complementary bit lines may have a length that is about 4CPP, in accordance with various embodiments of the present disclosure. Such a significantly shorten length (e.g., in comparison with the 8CPP length of existing memory devices) allows the disclosed memory device to more flexibly scale up in dimensions, without sacrificing the loading on the bit lines (and complementary bit lines). For example, to form a 8×8 memory array, the length of bit lines and complementary bit lines of such a memory array may only be increased to about 8CPP, instead of 16CPP in the existing memory devices. Shorter bit lines typically have less resistance, which can advantageously decrease voltage drop along the bit lines and can in turn increase operation speed of the memory device.

Although the word lines (e.g., WL[0] to WL[3]) and bit lines (e.g., ABL[0] to ABL[3], ABLB[0] to ABLB [3], BBL[0] to BBL[3], BBLB [0] to BBLB[3]) are shown as extending along the X direction and the Y direction, respectively, in the layout schematic 400 of FIG. 2A, it should be understood that corresponding physical interconnect structures functioning as such access lines can extend along the other direction while remaining within the scope of the present disclosure. Further, while the bit lines can be formed as interconnect structures, respectively, in a bottommost metallization layer (sometimes referred to as "M0 tracks") that extend along the Y direction and the word lines can be formed as interconnect structures, respectively, in a next upper metallization layer (sometimes referred to as "M1 tracks") that extend along the X direction, the word lines can be formed in one or more even upper metallization layers. For example, the word lines WL[0] to WL[3] may be formed as interconnect structures, respectively, in an even upper metallization layer (e.g., as M3 tracks or M5 tracks) that extend along the X direction. In yet another example, a first subgroup of the word lines, e.g., WL[0] and WL[2], may be formed as M3 tracks, respectively, and a second subgroup of the word lines, e.g., WL[1] and WL[3], may be formed as M5 tracks, respectively.

Figure 5:
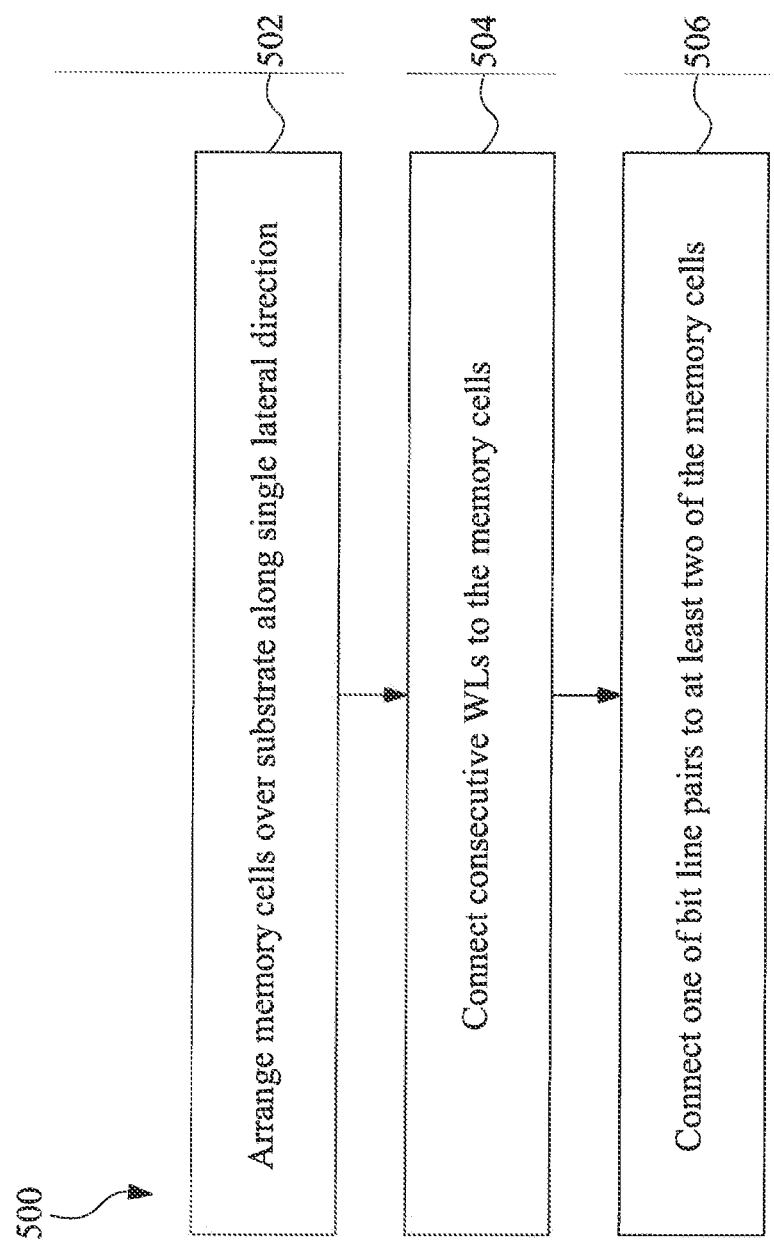
FIG. 5 illustrates a flowchart of a method for forming a memory device, in accordance with some embodiments.

FIG. 5 illustrates a flowchart of an example method for forming a memory device, in accordance with some embodiments. In some embodiments, the operations of method 500 are performed in the order depicted in FIG. 5. In some embodiments, the operations of method 500 may be performed simultaneously and/or in an order other than the order depicted in FIG. 5.

The method 500 starts with operation 502 in which a plurality of memory cells are arranged over a substrate along a single lateral direction. In some embodiments, as discussed above, each of the memory cells may include a plurality of transistors and may be arranged in a 4CPP architecture.

The substrate may be a semiconductor substrate, such as a bulk semiconductor, or the like, which may be doped (e.g., with a p-type or an n-type dopant) or undoped. The substrate 802 may be a wafer, such as a silicon wafer. Other substrates, such as a multi-layered or gradient substrate may also be used. In some embodiments, the semiconductor material of the substrate 802 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further at operation 502, the memory cells can be formed on the substrate based on the layout schematic 200 (FIG. 2A) or the layout schematic 400 (FIG. 4A). For example in FIG. 2A, the memory cells (corresponding to, e.g., 204-0, 204-1, 204-2, 204-3, etc.) are each formed with a 4CPP architecture, and the memory cells are laterally abutted to one another along the single X direction. For example in FIG. 4A, the memory cells (corresponding to, e.g., 404-0, 404-1, 404-2, 404-3, etc.) are each formed with a 4CPP architecture, and the memory cells are laterally abutted to one another along the single X direction. In some embodiments, a number of memory cells in the same column can form a block, and each memory cell corresponds to a respective sub-block of that block.

The method 500 continues to operation 504 in which consecutive ones of a plurality of WLs are connected to the plurality of the memory cells. In some embodiments, the memory cells of each block (corresponding to, e.g., 204-0, 204-1, 204-2, 204-3, etc.) may each be connected to a respective one of the word lines. In the example discussed above, four blocks (202A to 202D, 402A to 402D) are each connected to the word lines, WL[0], WL[1], WL[2], and WL[3]. As such, first through fourth memory cells (of the first block) can be connected to the word lines WL[0] to WL[3], respectively; fifth through eighth memory cells (of the second block) can also be connected to the word lines WL[0] to WL[3], respectively; ninth through twelfth memory cells (of the third block) can also be connected to the word lines WL[0] to WL[3], respectively; and thirteenth through sixteenth memory cells (of the fourth block) can be connected to the word lines WL[0] to WL[3], respectively. Further, the four memory cells of each block may be connected to the respective word lines at different locations offset from one another along a lateral direction orthogonal to a lengthwise direction of the word lines.

The method 500 continues to operation 506 in which one of a number of bit line pairs are connected to at least two of the plurality of memory cells. Continuing with the foregoing example in FIG. 2A, the four memory cells of block 202A (e.g., 204-0, 204-1, 204-2, and 204-3) may be connected to (or share) bit line BL[0] and BLB [0]; the four memory cells of block 202B may be connected to (or share) bit line BL[1] and BLB [1]; the four memory cells of block 202C may be connected to (or share) bit line BL[2] and BLB[2]; and the four memory cells of block 202D may be connected to (or share) bit line BL[3] and BLB [3]. In the example of FIG. 4A, the first two memory cells of block 402A (e.g., 404-0 and 404-1) may be connected to (or share) bit line ABL[0] and ABLB[0]; the second two memory cells of block 402A (e.g., 404-2 and 404-3) may be connected to (or share) bit line BBL[0] and BBLB [0]; the first two memory cells of block 402B may be connected to (or share) bit line ABL[1] and ABLB [1]; the second two memory cells of block 402B may be connected to (or share) bit line BBL [1] and BBLB [1]; the first two memory cells of block 402C may be connected to (or share) bit line ABL[2] and ABLB [2]; the second two memory cells of block 402C may be connected to (or share) bit line BBL[2] and BBLB[2]; the first two memory cells of block 402D may be connected to (or share) bit line ABL[3] and ABLB[3]; the second two memory cells of block 402D may be connected to (or share) bit line BBL[3] and BBLB[3].

In one aspect of the present disclosure, a memory array is disclosed. The memory array includes a plurality of memory cells disposed over a substrate, wherein each of the memory cells is coupled to a corresponding one of a plurality of word lines and a corresponding one of a plurality of bit line pairs. The first four of the memory cells that are coupled to four consecutive ones of the word lines and to a first one of the bit line pairs are abutted to one another on the substrate along a single lateral direction.

In another aspect of the present disclosure, a memory array is disclosed. The memory device includes a first memory cell, a second memory cell, a third memory cell, and a fourth memory cell abutted to one another along a single lateral direction. Each of the first to fourth memory cells includes a plurality of transistors formed based on a four contacted polysilicon pitch (4CPP) transistor architecture, and the first to fourth memory cells are operatively coupled to a first word line, a second word line, a third word line, and a fourth word line, respectively.

In yet another aspect of the present disclosure, a method for making memory arrays is disclosed. The method includes arranging first four memory cells over a substrate along a single lateral direction, each of the first four memory cells comprising a plurality of transistors formed based on a four contacted polysilicon pitch (4CPP) architecture. The method further includes connecting four consecutive ones of a plurality of word lines to the first four memory cells, respectively, and connecting a first one of a plurality of bit line pairs to at least two of the first four memory cells.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array, comprising:
a plurality of memory cells disposed over a substrate, wherein each of the plurality of memory cells is coupled to a corresponding one of a plurality of word lines and a corresponding one of a plurality of bit line pairs,
wherein first four memory cells of the plurality of memory cells that are coupled to four consecutive ones of the plurality of word lines are abutted to one another on the substrate along a single lateral direction,
wherein two of the first four memory cells are operatively coupled to a first one of the plurality of bit line pairs and other two of the first four memory cells are operatively coupled to a second one of the plurality of bit line pairs, and
wherein the first one of the plurality of bit line pairs and the second one of the plurality of bit line pairs correspond to one of a plurality of columns.

2. The memory array of claim 1, wherein the plurality of memory cells are formed based on a four contacted polysilicon pitch (4CPP) transistor architecture.

3. The memory array of claim 1, wherein the four consecutive ones of the plurality of word lines correspond to four of a plurality of rows, respectively.

4. The memory array of claim 1, further comprising:
a first source/drain contact structure continuously extending across the first four memory cells; and
a second source/drain contact structure continuously extending across the first four memory cells.

5. The memory array of claim 4, wherein the first source/drain contact structure is in electrical contact with one of the first one of the plurality of bit line pairs, and the second source/drain contact structure is in electrical contact with the other one of the first one of the plurality of bit line pairs.

6. The memory array of claim 1, wherein second four memory cells of the plurality of memory cells are also coupled to the four consecutive ones of the plurality of word lines but to another one of the plurality of bit line pairs.

7. The memory array of claim 6, wherein the second four memory cells are abutted to one another on the substrate along the same single lateral direction.

8. A memory array, comprising:
a first memory cell, a second memory cell, a third memory cell, and a fourth memory cell abutted to one another along a single lateral direction,
wherein each of the first to fourth memory cells includes a plurality of transistors formed based on a four contacted polysilicon pitch (4CPP) transistor architecture,
wherein the first to fourth memory cells are operatively coupled to a first word line, a second word line, a third word line, and a fourth word line, respectively,
wherein the first and second memory cells are operatively coupled to a first bit line pair and the third and fourth memory cells are operatively coupled to a second bit line pair, and
wherein both the first bit line pair and the second bit line pair correspond to one of a plurality of columns.

9. The memory array of claim 8, wherein the first to fourth word lines correspond to four consecutive ones of a plurality of rows, respectively.

10. The memory array of claim 9, wherein the first to fourth memory cells are operatively coupled to the first bit line pair that correspond to one of the plurality of columns.

11. The memory array of claim 10, further comprising:
a first source/drain contact structure continuously extending across the first to fourth memory cells; and
a second source/drain contact structure continuously extending across the first to fourth memory cells.

12. The memory array of claim 11, wherein the first source/drain contact structure is in electrical contact with one of the first bit line pair, and the second source/drain contact structure is in electrical contact with the other one of the first bit line pair.

13. The memory array of claim 8, further comprising:
a first source/drain contact structure extending across the first and second memory cells; and
a second source/drain contact structure extending across the first and second memory cells.

14. The memory array of claim 13, further comprising:
a third source/drain contact structure extending the third and fourth memory cells;
a fourth source/drain contact structure extending across the third and fourth memory cells.

15. The memory array of claim 14, wherein the first source/drain contact structure is in electrical contact with one of the first bit line pair, the second source/drain contact structure is in electrical contact with the other one of the first bit line pair, the third source/drain contact structure is in electrical contact with one of the second bit line pair, and the fourth source/drain contact structure is in electrical contact with the other one of the second bit line pair.

16. The memory array of claim 8, further comprising:
a fifth memory cell, a sixth memory cell, a seventh memory cell, and an eighth memory cell abutted to one another along the single lateral direction;
wherein each of the fifth to eighth memory cells includes the plurality of transistors formed based on the 4CPP transistor architecture;
wherein the fifth to eighth memory cells are also operatively coupled to the first word line, the second word line, the third word line, and the fourth word line, respectively.

17. A method for making memory arrays, comprising:
arranging first four memory cells over a substrate along a single lateral direction, each of the first four memory cells comprising a plurality of transistors formed based on a four contacted polysilicon pitch (4CPP) architecture;
connecting four consecutive ones of a plurality of word lines to the first four memory cells, respectively;
connecting a first one of a plurality of bit line pairs to at least two of the first four memory cells; and
connecting a second one of the plurality of bit line pairs to the other two of the first four memory cells,
wherein both the first one of the plurality of bit line pairs and the second one of the plurality of bit line pairs correspond to one of a plurality of columns.

18. The method of claim 17, further comprising:
arranging second four memory cells over the substrate along the single lateral direction, each of the second four memory cells comprising the plurality of transistors formed based on the 4CPP architecture; and
connecting the four consecutive one of the word lines to the second four memory cells, respectively.

19. The method of claim 18, further comprising:
connecting a third one of the plurality of bit line pairs to at least two of the second four memory cells.

20. The method of claim 19, further comprising:
connecting a fourth one of the plurality of bit line pairs to the other two of the second four memory cells.

\* \* \* \* \*